United States Patent
Kuramoto et al.

(10) Patent No.: US 8,244,973 B2
(45) Date of Patent: Aug. 14, 2012

(54) RELAY APPARATUS AND DATA CONTROL METHOD

(75) Inventors: Michio Kuramoto, Kawasaki (JP); Kanta Yamamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 295 days.

(21) Appl. No.: 12/645,071

(22) Filed: Dec. 22, 2009

(65) Prior Publication Data

US 2010/0100672 A1  Apr. 22, 2010

Related U.S. Application Data

(63) Continuation of application No. PCT/JP2007/063310, filed on Jul. 3, 2007.

(51) Int. Cl.
*G06F 12/00* (2006.01)

(52) U.S. Cl. ................. 711/108; 711/E12.001

(58) Field of Classification Search .......... 711/108, 711/E12.001
See application file for complete search history.

(56) References Cited

U.S. PATENT DOCUMENTS

| | | |
|---|---|---|
| 5,396,448 A | 3/1995 | Takayanagi et al. |
| 5,815,500 A | 9/1998 | Murono |
| 2006/0181909 A1 * | 8/2006 | Hinojosa et al. ............. 365/49 |
| 2006/0212648 A1 * | 9/2006 | Cox et al. ............. 711/108 |
| 2007/0261059 A1 * | 11/2007 | Orth et al. ............. 719/312 |
| 2010/0228947 A1 * | 9/2010 | Sasao ............. 711/216 |

FOREIGN PATENT DOCUMENTS

| | | |
|---|---|---|
| JP | 4-325996 | 11/1992 |
| JP | 9-162922 | 6/1997 |

OTHER PUBLICATIONS

International Search Report dated Sep. 25, 2007 for the corresponding International Application No. PCT/JP2007/063310.
English Translation of the Written Opinion of the International Searching Authority dated Sep. 25, 2007, from corresponding International Application No. PCT/JP2007/063310.

* cited by examiner

*Primary Examiner* — Kevin Ellis
*Assistant Examiner* — Mehdi Namazi
(74) *Attorney, Agent, or Firm* — Katten Muchin Rosenman LLP

(57) ABSTRACT

When a data word is designated through a network search engine, a FIFO unit, and the like, a relay apparatus according to the invention searches for an associative memory address corresponding to the data word. Even when the associative memory address is internally converted to a contents memory address, the relay apparatus stores the contents memory address by causing it to correspond to a search result corresponding to the contents memory address as well as outputs the associative memory address together with the search result.

6 Claims, 6 Drawing Sheets

RELAY APPARATUS AND DATA CONTROL METHOD

CROSS-REFERENCE TO RELATED APPLICATION(S)

This application is a continuation of International Application No. PCT/JP2007/063310, filed on Jul. 3, 2007, the entire contents of which are incorporated herein by reference.

FIELD

The embodiment discussed herein is directed to a relay apparatus and the like having an associative memory for searching for an address of data relating to a data word, a contents memory for storing data corresponding to the address searched for by the associative memory, and a chip for searching for data relating to the data word from the contents memory and outputting the data when the data word is designated.

BACKGROUND

A relay apparatus (router and the like) for relaying a frame on a network has a CAM (Content Addressable Memory) mounted thereon to improve a processing efficiency (refer to, for example, Japanese Laid-open Patent Publication No. 09-162922). The CAM is a memory for searching for a data word by itself when the data word is designated and outputting an address of a location in which the data word is stored.

Note that, recently, a CAM and a contents memory (memory for storing data corresponding to an address searched for by the CAM) are integrally arranged as a chip from a reason of reducing a cost and improving a processing efficiency, and the chip is mounted on a relay apparatus (for example, ASSP (Application Specific Standard Product)). The chip more improves the processing efficiency of the relay apparatus by searching for data corresponding to an address from a contents memory when a data word is designated omitting a process of outputting an address of a location in which the data word is stored to the outside and by directly outputting the data as the search result.

However, when a CAM and a contents memory is integrally arranged as a chip and mounted on a relay apparatus as described above, a problem arises in that the CAM cannot be efficiently used because an address in which data relating to a designated data word is stored cannot be obtained.

SUMMARY

According to an aspect of an embodiment of the invention, a relay apparatus includes an associative memory for searching for an address of data relating to a data word; a contents memory for storing data corresponding to the address searched for by the associative memory; a chip for searching the contents memory for data relating to the data word when the data word is designated and outputting the data, the chip storing a conversion table for converting an address of the contents memory to an associative memory address on the associative memory; a conversion unit for converting an associative memory address corresponding to a data word to an address of the contends memory when the data word is designated and the associative memory address is searched for by the associative memory; and an output control unit for searching for an associative memory address corresponding to the data word based on the address of the contents memory and the conversion table and outputting the associative memory address as the search result.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENTS

Preferred embodiments of the present invention will be explained with reference to accompanying drawings. Note that the invention is by no means limited by the embodiment.

Figure 1:
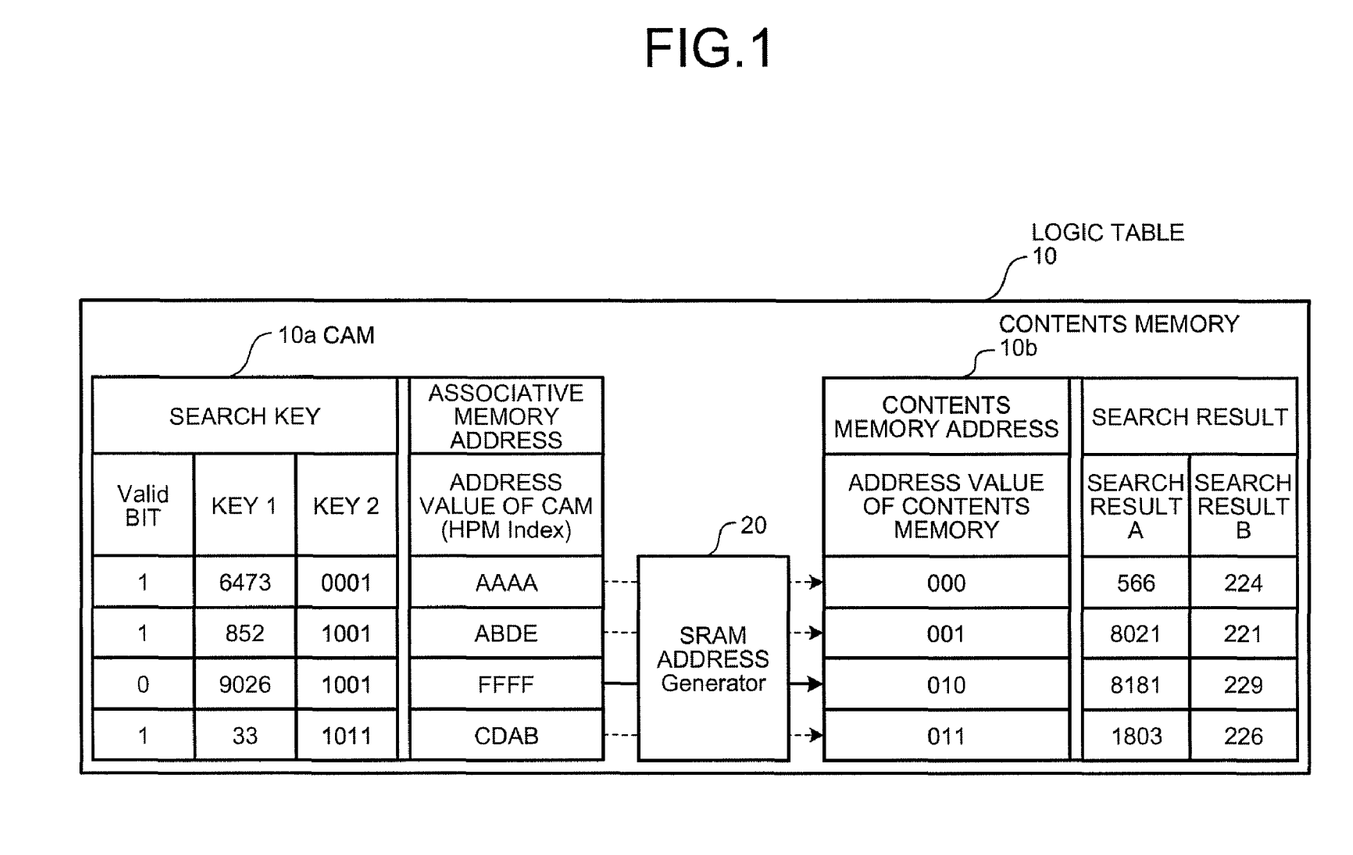
FIG. 1 is a view explaining a conventional technique.
Figure 2:
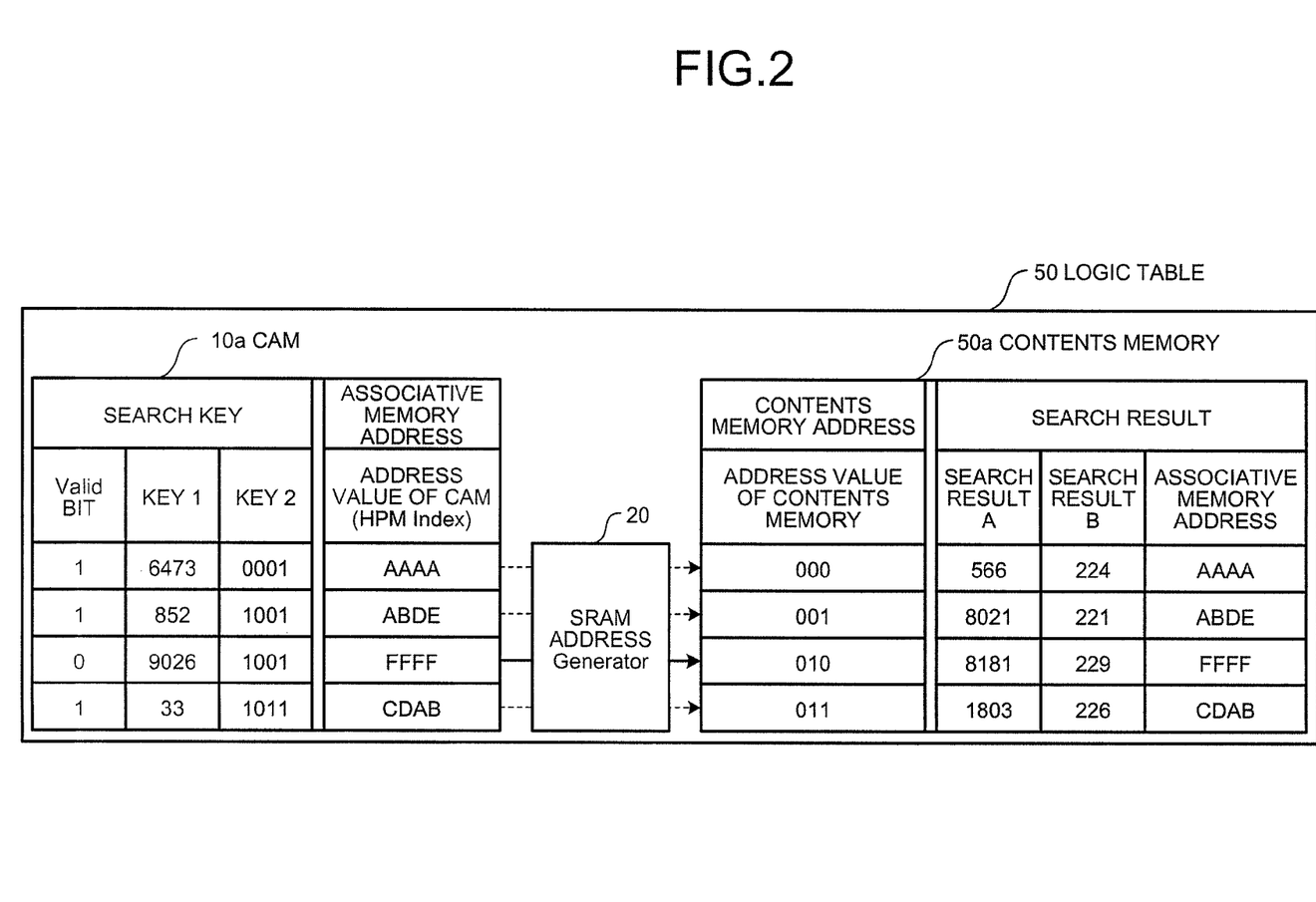
FIG. 2 is a view explaining an outline and a feature of the invention.

First, an outline and a feature of the invention will be explained in comparison with a conventional technique. FIG. 1 is a view explaining the conventional technique, and FIG. 2 is a view explaining the outline and the feature of the invention. First, the conventional technique will be explained.

As illustrated in FIG. 1, conventionally, a logic table 10, in which a CAM (Content Addressable Memory) 10a is caused to correspond to a contents memory 10b by an SRAM address Generator 20, is arranged as a chip, and the chip is mounted on a relay apparatus such as a router and the like and used to transfer a frame.

Among them, the CAM 10a is a memory (associative memory) for searching for, when a data word is designated, a memory address (associative memory address) of data relating to the designated data word, and the contents memory 10b is a memory for storing data corresponding to the associative memory address.

Further, the SRAM address Generator 20 is a processing unit for converting an associative memory address of the CAM 10a to a contents memory address of the contents memory 10b. The associative memory address is a memory address used in the CAM 10a, and the contents memory address is a memory address used in the contents memory 10b. It is assumed that a corresponding relation between the associative memory address and the contents memory address is previously set by a manager and the like.

The CAM 10a of FIG. 1 has a search key composed of a Valid bit, a key 1, and a key 2 and an associative memory address, and the contents memory 10b has a contents memory address and a search result (search results A and B) corresponding to the contents memory.

Among them, the Valid bit is information illustrating whether or not a corresponding entry is valid. When the Valid bit is "1", it exhibits that the corresponding entry is valid, whereas when the Valid bit is "0", it exhibits that the corresponding entry is invalid. When an empty entry is searched for, an entry by which the Valid bit is set to "0" is searched for. Further, the key 1 and the key 2 store keywords relating to a data word.

When a data word is designated to the CAM 10a, the CAM 10a compares the designated data word with the key 1 and the key 2, searches for a keyword relating to the data word, and specifies an associative memory address from the keyword as the search result. When, for example, a keyword relating to the designated data word relates to "6473" of the key 1 (when "6473" is included in the data word), the CAM 10a specifies an associative memory address "AAAA".

The SRAM address Generator 20 converts the associative memory address "AAAA" to a contents memory address "000" from a corresponding relation between an associative memory address and a contents memory address which are previously set, and the contents memory address outputs a search result A "566" and a search result B "224" corresponding to the contents memory address "000".

As described above, conventionally, an associative memory address corresponding to a designated data word is internally converted to a contents memory address without being output, and data (search result) corresponding to the contents memory address is output. As a result, the CAM 10a cannot be efficiently used because an associative memory address of data relating to a data word cannot be obtained.

In contrast, to solve the problems of the conventional technique described above, in a logic table 50 according to the invention, a contents memory 50a stores its contents memory address and an associative memory address memory by causing them to correspond to each other as illustrated in FIG. 2. That is, even when an associative memory address is internally converted to a contents memory address by the SRAM address Generator 20, data (search result) corresponding to the contents memory address is output as well as the associative memory address which is caused to correspond to the contents memory address is output.

When, for example, the contents memory address "000" is output from the SRAM address Generator 20, a search result A "566" and a search result B "224" corresponding to the contents memory address "000" are output as well as an associative memory address "AAAA" corresponding to the contents memory address "000" is output.

As described above, in the invention, even when the associative memory address is internally converted to the contents memory address, a search result corresponding to the contents memory address and an associative memory address corresponding to the contents memory address can be obtained. As a result, the CAM 10a can be efficiently used because a location in which data relating to a data word can be found.

Figure 3:
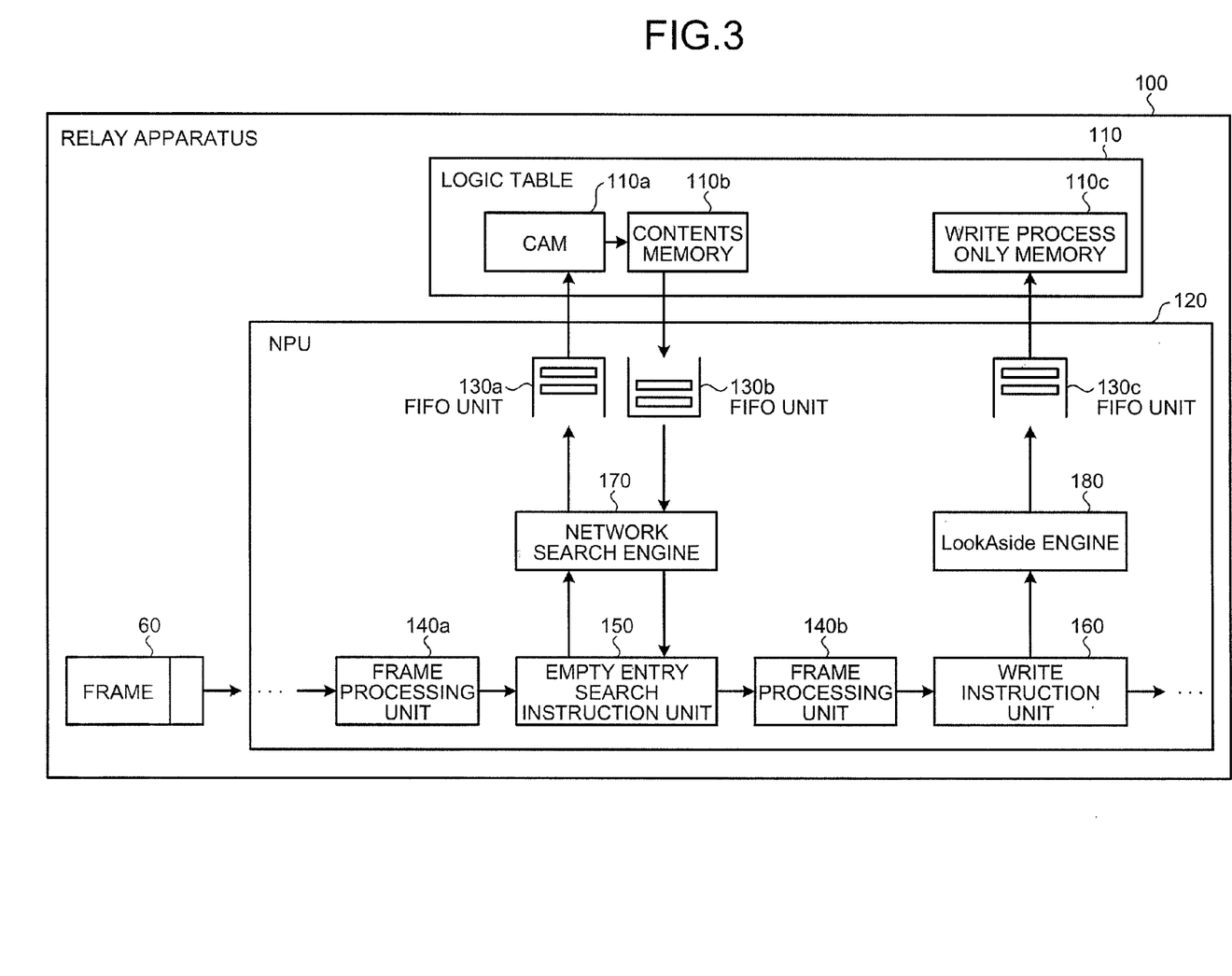
FIG. 3 is a function block diagram illustrating an arrangement of a relay apparatus according to an embodiment.

Next, an arrangement of the relay apparatus according to the embodiment will be explained. FIG. 3 is a function block diagram illustrating an arrangement of the relay apparatus according to the embodiment. A relay apparatus 100 according to the embodiment is an apparatus arranged such that when the apparatus obtains a frame 60, it transfers the obtained frame 60 to a predetermined address. In particularly, a relay apparatus closely relating to the invention has a logic table 110 and an NPU (Network Processing Unit) 120 as illustrated in FIG. 3. Since the other basic components of the relay apparatus is the same as those of the conventional relay apparatus (router and the like), explanation thereof is omitted in FIG. 3.

The logic table 110 has a CAM 110a, a contents memory 110b, and a write process only memory 110c. The CAM 110a corresponds to the CAM 10a explained in FIG. 1, and the contents memory 110b corresponds to the contents memory 50a explained in FIG. 2. Note that the write process only memory 110c is a memory for storing data corresponding to the associative memory address independently of the contents memory 110b.

Figure 4:
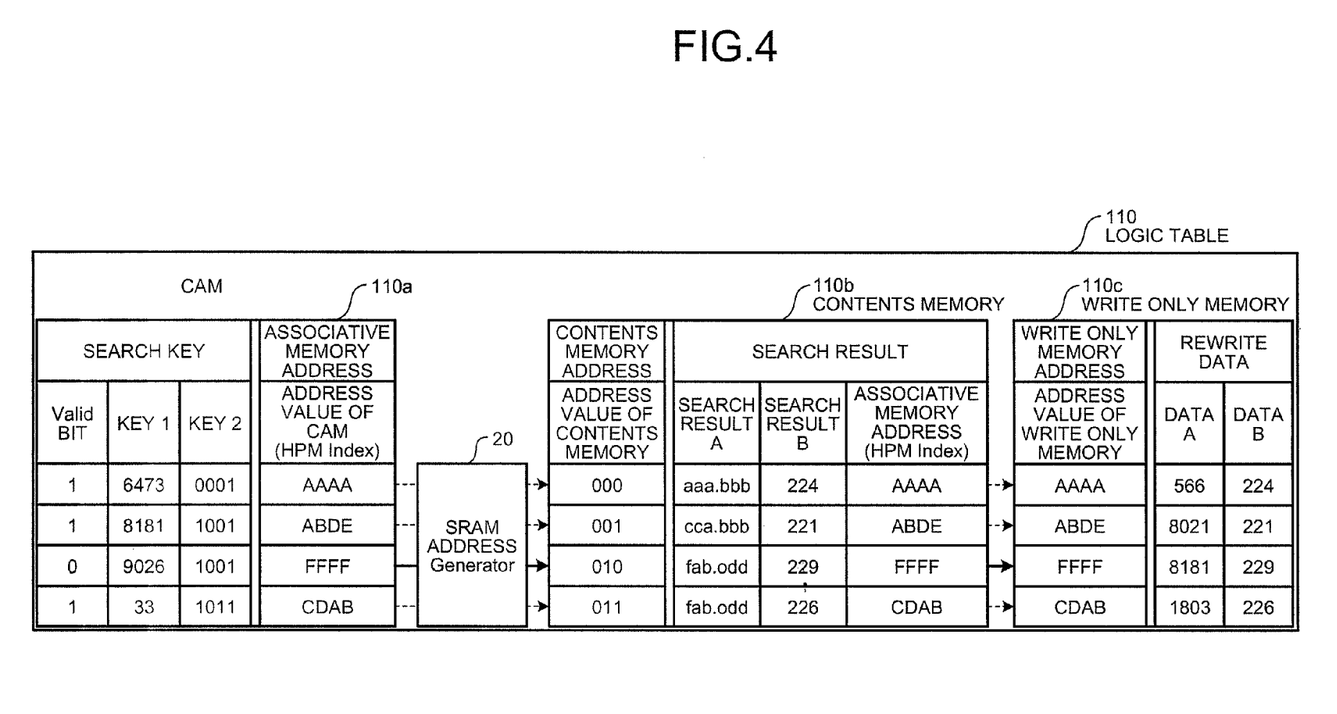
FIG. 4 is a view explaining a logic table in detail.

The logic table 110 illustrated in FIG. 3 will be explained in detail. FIG. 4 is a view explaining the logic table 110 in detail. As illustrated in FIG. 4, the logic table 110 has the CAM 110a, the contents memory 110b, the write process only memory 110c, and the SRAM address Generator 20.

The CAM 110a has a Valid bit, a search key composed of a key 1 and a key 2 and an associative memory address likewise the CAM 10a illustrated in FIG. 1. Further, the contents memory 110b has a contents memory address, a search result A, a search result B, and a search result composed of the associative memory address corresponding to the contents memory address likewise the contents memory 50a illustrated in FIG. 2.

Further, the write process only memory 110c is a memory for storing data in correspondence to the associative memory address independently of the contents memory 110b and has a write only memory address and rewrite data composed of data A and data B. Further, the write only memory address and the associative memory address are caused to correspond to each other.

For example, the write process only memory 110c stores data (data A "566", data B "224") relating to a key 1 "6473" and a key 2 "0001" to an entry that has the same write only memory address "AAAA" as an associative memory address of the CAM 110a corresponding to the key 1 "6473" and the key 2 "0001".

A storage capacity can be easily increased by including the write process only memory 110c to logic table independently of the contents memory 110b as described above.

Returning to the explanation of FIG. 3, the NPU 120 has a FIFO (First In First Out) units 130a to 130c, frame processing units 140a, 140b, an empty entry search instruction unit 150, a write instruction unit 160, a network search engine 170, and a LookAside engine 180. After the frame 60 is input to the NPU 120, it passes through the respective processing units (frame processing units 140a, 140b, the empty entry search instruction unit 150, and the write instruction unit 160), and the respective processing units access the logic table 110 when necessary.

The FIFO unit 130a is a processing unit for receiving various process instructions from the network search engine 170 and outputting them to the CAM 110a in an order in which they are received. The FIFO unit 130b is a processing unit for receiving output results output from the contents memory 110b and outputting them to the network search engine in an order in which they are received. Further, the FIFO unit 130c is a processing unit for receiving process instructions from the LookAside engine 180 and outputting them to the write process only memory 110c in an order in which they are received.

When the frame processing unit 140a obtains the frame 60 and receives an empty entry search instruction from a controller (not illustrated), it outputs the empty entry search instruction to the empty entry search instruction unit 150 as well as outputs the frame 60 to the empty entry search instruction unit 150. The empty entry search instruction is an instruction for searching for an empty entry of the CAM 110a.

When the frame processing unit 140b obtains the frame 60 and obtains a write process instruction from the controller (not illustrated), it outputs the write process instruction to the write instruction unit 160 as well as outputs the frame 60 to the write instruction unit 160.

When the empty entry search instruction unit 150 obtains the empty entry search instruction, it starts the network search engine 170 and outputs the empty entry search instruction to the network search engine 170. Further, the empty entry search instruction unit 150 outputs the frame 60 obtained from the frame processing unit 140*a* to the frame processing unit 140*b*.

When the write instruction unit 160 obtains the write process instruction, it starts the LookAside engine 180 and outputs the write process instruction to the LookAside engine 180. Further, the write instruction unit 160 outputs the frame 60 obtained from the frame processing unit 140*b* other processing units (not illustrated). After the frame 60 passes through the other processing units, it is output to other relay apparatus connected to the relay apparatus 100.

The network search engine 170 is a processing unit arranged such that when it obtains the empty entry search instruction from the empty entry search instruction unit 150, it requests a Lookup process relating to the empty entry search to the CAM 110*a* in the logic table 110 through the FIFO unit 130*a*.

The Lookup process of the empty entry search performed by the CAM 110*a* will be explained using FIG. 4. When the Valid bit is set to "0" since an entry becomes an empty entry, the CAM 110*a* searches for an entry in which the Valid bit in the search key is set to "0". In an example illustrated in FIG. 4, an entry of a third stage corresponds to the empty entry.

The CAM 110*a* outputs an associative memory address of the empty entry to the SRAM address Generator 20 which converts the associative memory address to the contents memory address. The contents memory 110*b* searches for an associative memory address corresponding to the contents memory address from the correspondence relation of its contents memory address and the associative memory address and outputs the associative memory address as the search result to the network search engine 170 through the FIFO unit 130*b*.

When the network search engine 170 obtains an associative memory address that is a response to the empty entry search instruction, it outputs the obtained associative memory address to the empty entry search instruction unit 150.

The LookAside engine 180 is a processing unit arranged such that when it obtains a write instruction from the write instruction unit 160, it designates a data word through the FIFO unit 130*c* and requests the write process only memory 110*c* in the logic table 110 to record corresponding data (for example, data contained in the frame 60). The data word designated by the LookAside engine 180 may be a part of data to be a recorded, or a previously set data word may be used as the data word.

A write process performed by the CAM 110*a* in response to an instruction of the LookAside engine 180 will be explained using FIG. 4. The CAM 110*a* compares a designated data word with a search key and outputs an associative memory address. When, for example, "8181" is included a data word, the CAM 110*a* outputs an associative memory address "ABDE" corresponding to the search key.

The SRAM address Generator 20 converts the associative memory address "ABDE" to a contents memory address "011". The contents memory 110*b* converts the contents memory address "001" to the associative memory address "ABDE" again making use of a table thereof and outputs the associative memory address "ABDE" to the write process only memory 110*c*.

The write process only memory 110*c* stores data to be written that is output from the LookAside engine 180 to an entry corresponding to the associative memory address "ABDE" output from the contents memory 110*b*.

Figure 5:
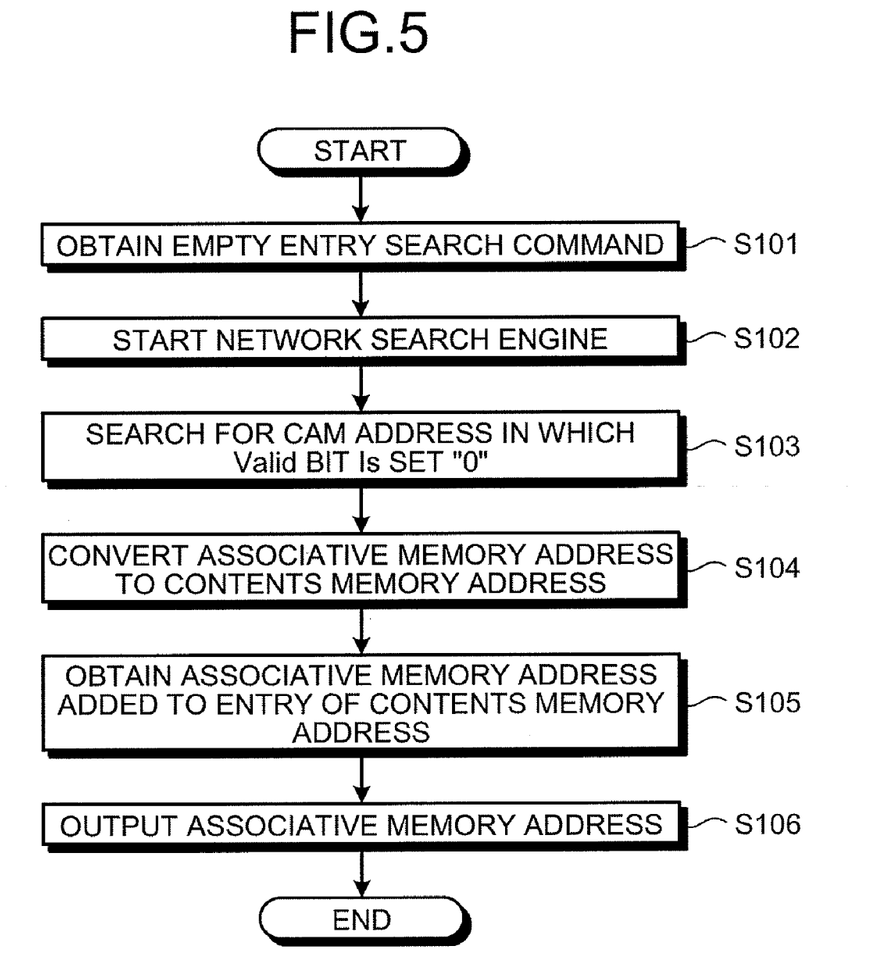
FIG. 5 is a flowchart illustrating a processing procedure when the relay apparatus according to the embodiment performs an empty entry search process.

Next, a processing procedure of the relay apparatus 100 according to the embodiment will be explained. First, a process when the relay apparatus 100 according to the embodiment performs an empty entry search process will be explained. FIG. 5 is a flowchart illustrating a processing procedure when the relay apparatus 100 according to the embodiment performs the empty entry search process. As illustrated in FIG. 5, the empty entry search instruction unit 150 obtains an empty entry search instruction (step S101) and starts the network search engine 170 (step S102).

The CAM 110*a* searches for a CAM address in which the Valid bit is set "0" (step S103), converts an associative memory address to a contents memory address (step S104), obtains the associative memory address added to an entry of the contents memory address (step S105), and outputs the associative memory address to the network search engine 170 (step S106).

As described above, since the relay apparatus 100 according to the embodiment outputs an associative memory address of an empty entry which is caused to correspond to the contents memory 110*b*, the CAM 110*a* can be effectively used making use of the associative memory address.

Figure 6:
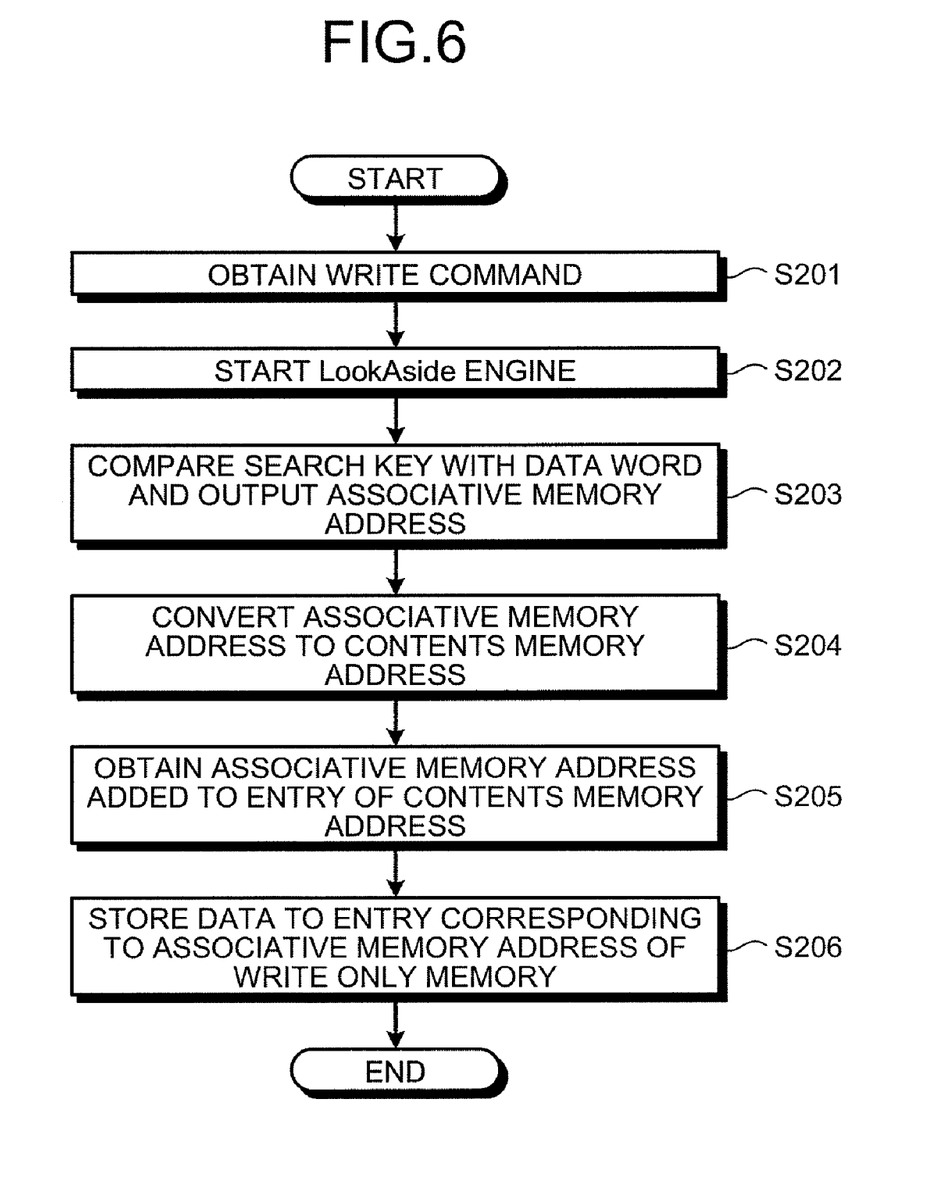
FIG. 6 is a flowchart illustrating a processing procedure in which the relay apparatus according to the embodiment records data to a write process only memory.

Next, a process, in which the relay apparatus 100 according to the embodiment records data to the write process only memory, will be explained. FIG. 6 is a flowchart illustrating a processing procedure in which the relay apparatus 100 according to the embodiment records the data to the write process only memory.

As illustrated in FIG. 6, the write instruction unit 160 obtains a write instruction (step S201) and starts the LookAside engine 180 (step S202), and the CAM 110*a* compares a search key with a data word and outputs the associative memory address (step S203).

Then, the CAM 110*a* converts the associative memory address to the contents memory address (step S204) and obtains an associative memory address added to the entry of the contents memory address (step S205), and the NPU 120 stores data to an entry corresponding to the associative memory address of the write process only memory 110 (step S206).

As described above, the relay apparatus 100 according to the embodiment can easily increase a data capacity of the logic table 110 using the write process only memory 110*c*.

As described above, even when the relay apparatus 100 according to the embodiment searches for an associative memory address corresponding to a data word and internally converts the associative memory address to a contents memory address at the time the data word is designated, the relay apparatus 100 stores the associative memory address by causing it to correspond to a search result corresponding to the contents memory address and outputs the associative memory address together with the search result. As a result, the CAM 10*a* can be efficiently used because it can obtain an associative memory address of data relating to the data word.

The processes, which are automatically performed in the embodiment, can be entirely or partly performed manually. Otherwise, the processes, which are manually performed in the above explanation, can be entirely or partly performed automatically. In addition to the above-mentioned, the processing procedures, the control procedures, the specific names, and the information including various data and parameters illustrated in the document and the drawings can be arbitrarily changed unless otherwise specified.

Further, since the functions of the respective components of the relay apparatus 100 in FIG. 3 are illustrated only conceptually, it is not always necessary to physically arrange them as illustrated in the drawings. That is, specific modes of division and integration of the respective units are not limited to the illustrated modes, and the respective units can be entirely or partly divided or integrated functionally or physically in arbitrary units according to various loads and a state of use. Further, the respective processing functions performed by the respective units can be entirely or arbitrarily partly realized by a CPU and a program analyzed and executed by the CPU or can be realized as hardware composed of a wired logic.

According to an embodiment, a chip including an associative memory and a contents memory stores a conversion table for converting an address of the contents memory to an associative memory address on the associative memory. When a data word is designated and an associative memory address corresponding to the data word is searched for by the associative memory, the associative memory address is converted to an address of the contents memory, an associative memory address corresponding to the data word is searched for based on the address of the contents memory and the conversion table, and the associative memory address as the search result is output. As a result, the associative memory can be efficiently used because the associative memory address of the data relating to the data word can be obtained.

According to an embodiment, since the relay apparatus has a write memory for storing data to an entry corresponding to the associative memory address searched for by the associative memory independently of the contents memory and writes data to the write memory, a data capacity can be easily increased.

Further, according to an embodiment, when the associative memory searches for the associative memory address by obtaining a data word and writes data to an entry corresponding to the associative memory address, the associative memory address searched for by the associative memory is converted to the address of the contents memory. A write unit converts again the address to an associative memory address based on the conversion table and the address of the contents memory and writes data to be written to an entry of the write memory corresponding to the associative memory address. As a result, the relay apparatus can efficiently write data without causing the write memory to perform complex processes.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A relay apparatus comprising:
   an associative memory for storing a first address group having a plurality of associative memory addresses and specifying a first associative memory address corresponding to designated data in the first address group;
   a conversion unit for converting the specified first associative memory address to a contents memory address; and
   a contents memory for storing a plurality of contents memory addresses and a second address group having a plurality of associative memory addresses that are same as the plurality of associative memory addresses in the first address group and respectively correspond to the plurality of contents memory addresses, and outputting a second associative memory address corresponding to the converted contents memory address out of the second address group.

2. The relay apparatus according to claim 1, further comprising:
   a write memory for storing data to an entry corresponding to the specified first associative memory address independently of the contents memory; and
   a write unit for writing data to the write memory.

3. The relay apparatus according to claim 2, wherein write unit writes data to be written to an entry of the write memory corresponding to the outputted second associative memory address.

4. A data control method comprising:
   in an associative memory, storing a first address group having a plurality of associative memory addresses;
   by the associative memory, specifying a first associative memory address corresponding to designated data in the first address group;
   converting the specified first associative memory address to a contents memory address;
   in a contents memory, storing a plurality of contents memory addresses and a second address group having a plurality of associative memory addresses that are same as the plurality of associative memory addresses in the first address group and respectively correspond to the plurality of contents memory addresses; and
   by the contents memory, outputting a second associative memory address corresponding to the converted contents memory address out of the second address group.

5. The data control method according to claim 4, further comprising writing data to a write memory for storing data to an entry corresponding to the specified first associative memory address independently of the contents memory.

6. The data control method according to claim 5, wherein the writing includes writing data to be written to an entry of the write memory corresponding to the outputted second associative memory address.

* * * * *